United States Patent
Kim et al.

(10) Patent No.: US 9,166,011 B2
(45) Date of Patent: Oct. 20, 2015

(54) SEMICONDUCTOR DEVICE HAVING STABLE GATE STRUCTURE AND METHOD OF MANUFACTURING THE SAME

(71) Applicant: Electronics and Telecommunications Research Institute, Daejeon (KR)

(72) Inventors: Seong Il Kim, Daejeon (KR); Dong Min Kang, Daejeon (KR); Sang Heung Lee, Daejeon (KR); Ho Kyun Ahn, Daejeon (KR); Hyung Sup Yoon, Daejeon (KR); Byoung Gue Min, Sejong (KR); Jong Won Lim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/328,247

(22) Filed: Jul. 10, 2014

(65) Prior Publication Data
US 2015/0236108 A1    Aug. 20, 2015

(30) Foreign Application Priority Data
Feb. 14, 2014 (KR) ........................ 10-2014-0017242

(51) Int. Cl.
| H01L 21/338 | (2006.01) |
| H01L 29/423 | (2006.01) |
| H01L 29/778 | (2006.01) |
| H01L 21/283 | (2006.01) |
| H01L 21/28  | (2006.01) |

(52) U.S. Cl.
CPC ........ *H01L 29/42312* (2013.01); *H01L 21/283* (2013.01); *H01L 21/28114* (2013.01); *H01L 29/778* (2013.01)

(58) Field of Classification Search
CPC ................... H01L 21/28114; H01L 29/42376; H01L 29/4238
USPC .......................... 438/182, 638, 640, 574, 579
See application file for complete search history.

(56) References Cited

U.S. PATENT DOCUMENTS

| 6,204,102 B1* | 3/2001  | Yoon et al. ..................... 438/182 |
| 6,635,404 B1  | 10/2003 | Choi et al. |
| 6,881,688 B2* | 4/2005  | Maile ............................. 438/622 |
| 8,003,300 B2* | 8/2011  | Jain et al. ...................... 430/311 |
| 2006/0079030 A1 | 4/2006 | Park et al. |
| 2011/0057237 A1* | 3/2011 | Ahn et al. ..................... 257/288 |

(Continued)

FOREIGN PATENT DOCUMENTS

| KR | 10-0274153 B1    | 12/2000 |
| KR | 10-2001-0048980 A | 6/2001  |

(Continued)

*Primary Examiner* — Kevin M Picardat
(74) *Attorney, Agent, or Firm* — Rabin & Berdo, P.C.

(57) ABSTRACT

Disclosed are a semiconductor device having a stable gate structure, and a manufacturing method thereof, in which a gate structure is stabilized by additionally including a plurality of gate feet under a gate head in a width direction of the gate head so as to serve as supporters in a gate structure including a fine gate foot having a length of 0.2 μm or smaller, and the gate head having a predetermined size. Accordingly, it is possible to prevent the gate electrode of the semiconductor device from collapsing, and improve reliability of the semiconductor device during or after the process of the semiconductor device.

11 Claims, 13 Drawing Sheets

(56) References Cited

U.S. PATENT DOCUMENTS

2012/0248416 A1* 10/2012 Zhou et al. .................. 257/29
2014/0361353 A1* 12/2014 Yin et al. .................. 257/288

FOREIGN PATENT DOCUMENTS

| KR | 10-0703998 B1 | 4/2007 |
| KR | 10-0941335 B1 | 2/2010 |

* cited by examiner

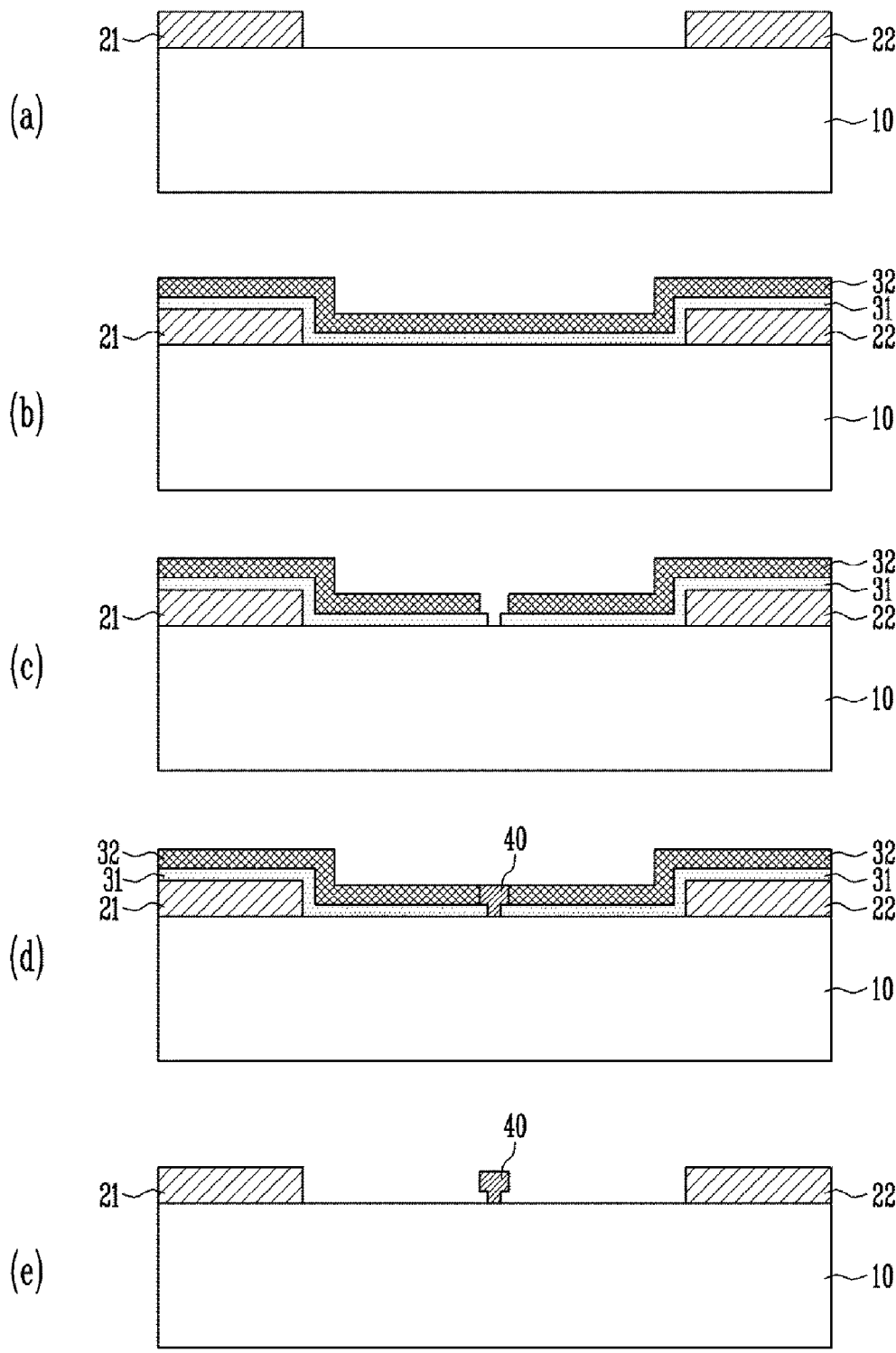

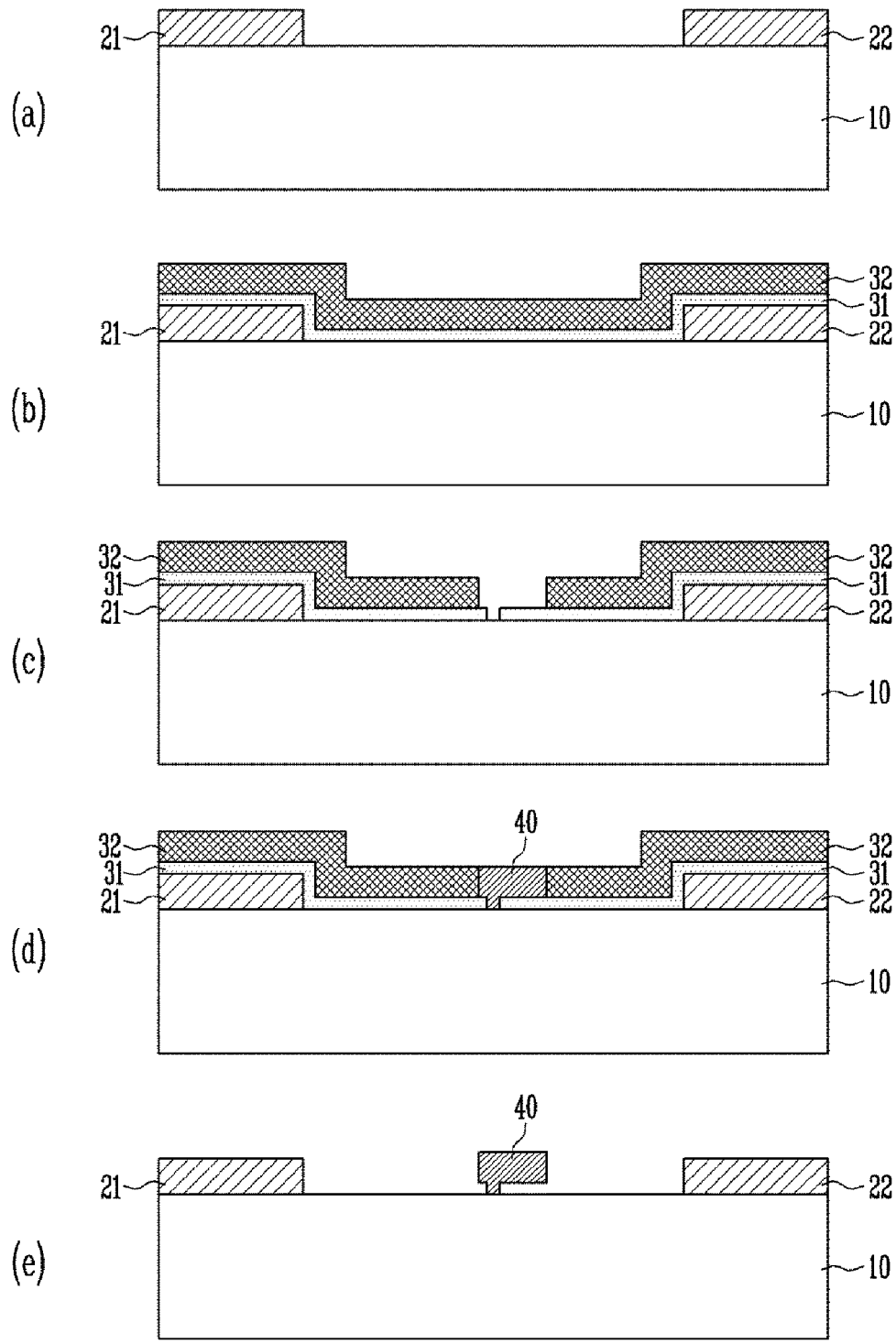

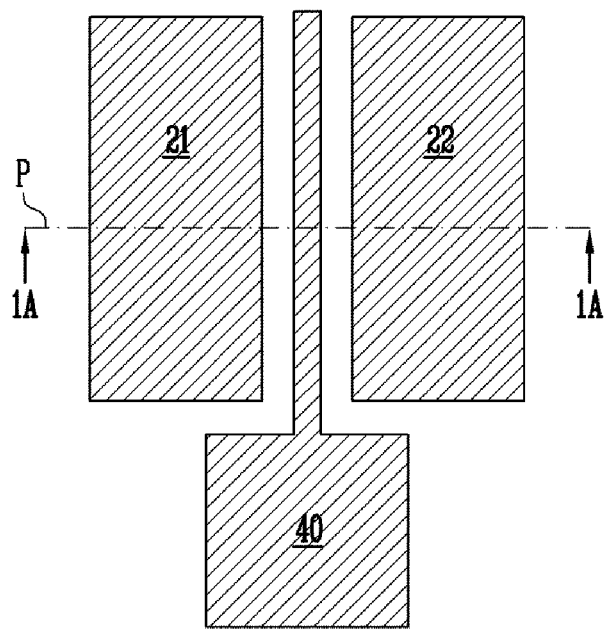

FIG. 6A
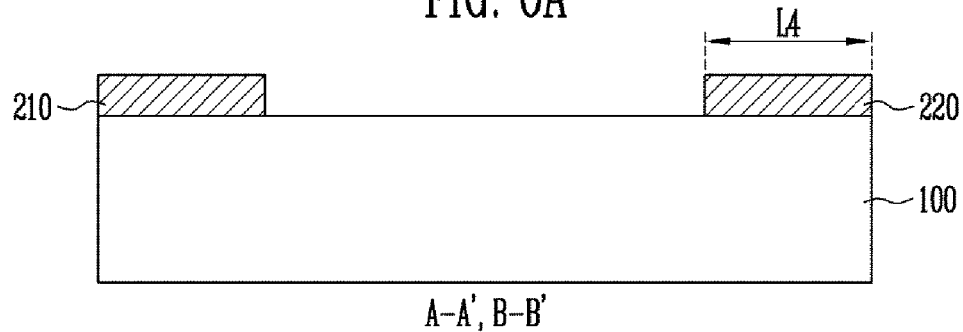
A-A', B-B'
FIG. 6B
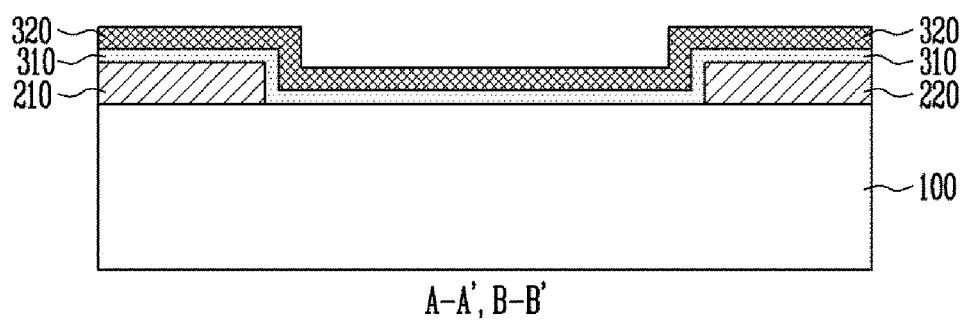
A-A', B-B'
FIG. 6C
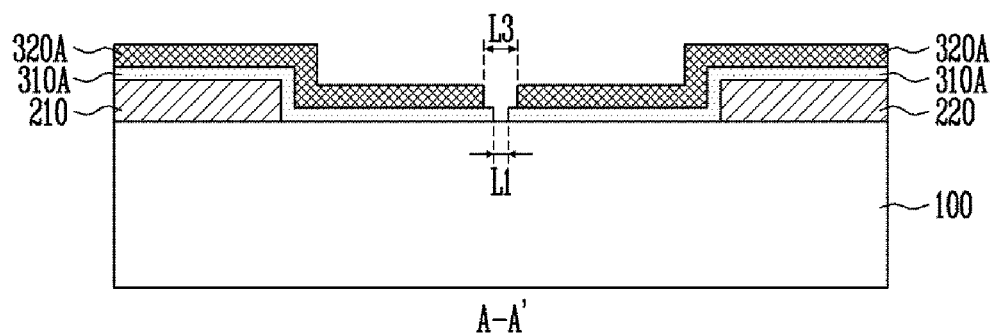
A-A'
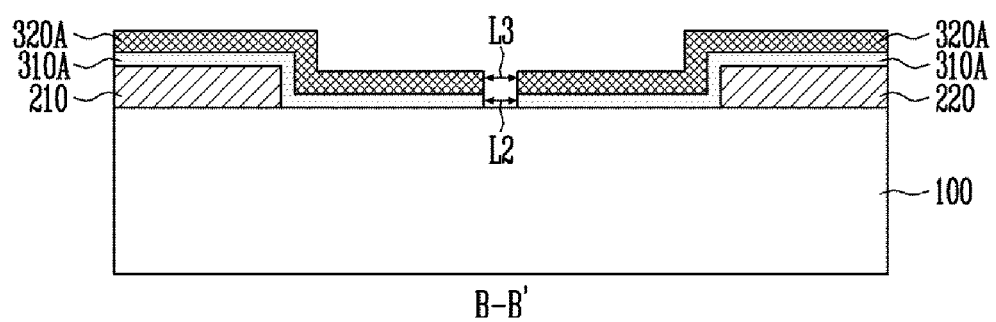
B-B'

FIG. 6D
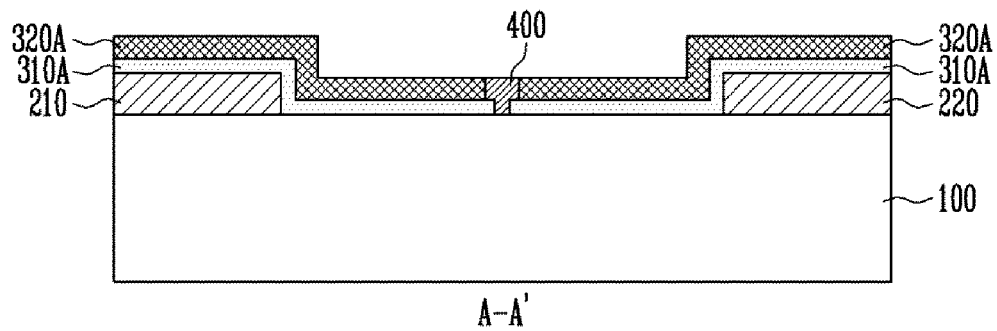
A-A'
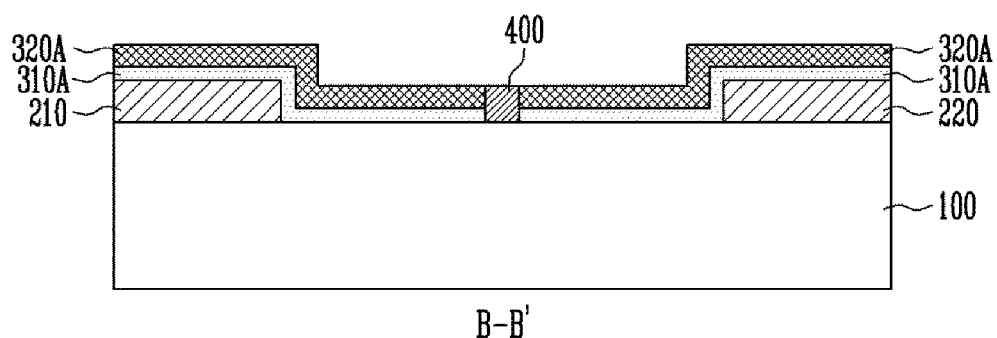
B-B'
FIG. 6E
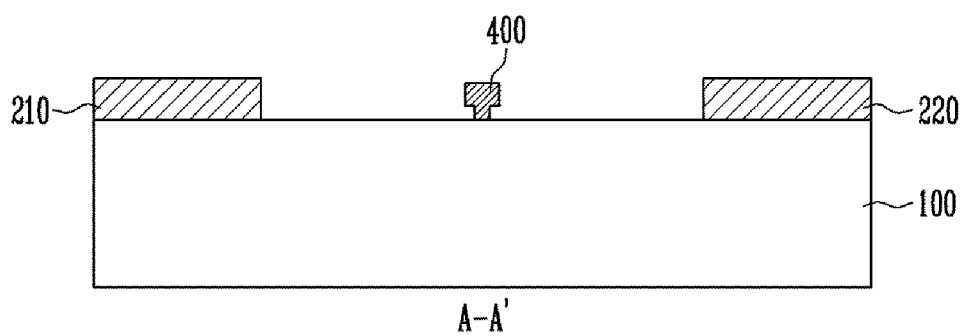
A-A'
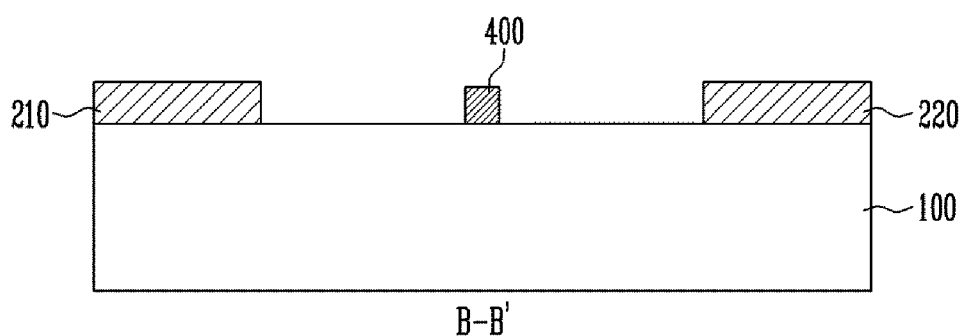
B-B'

FIG. 7A
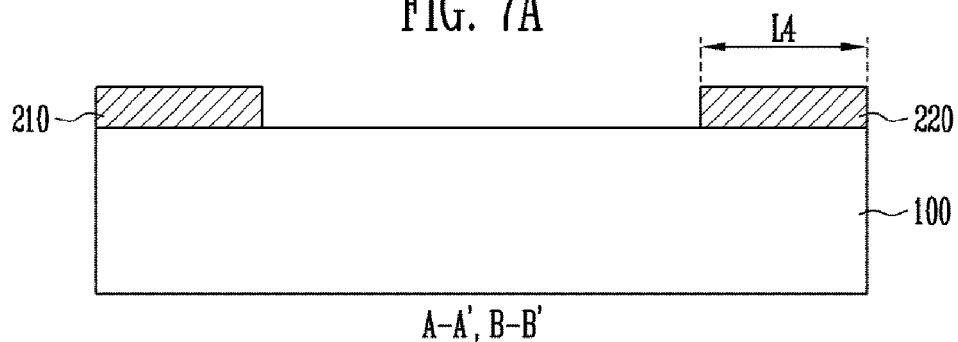
A-A', B-B'
FIG. 7B
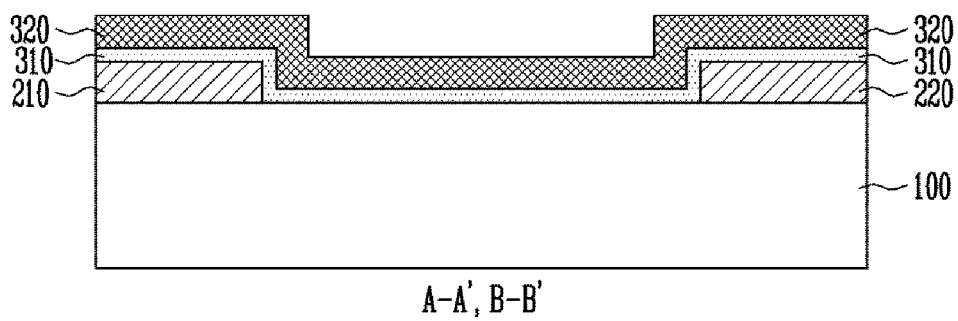
A-A', B-B'
FIG. 7C
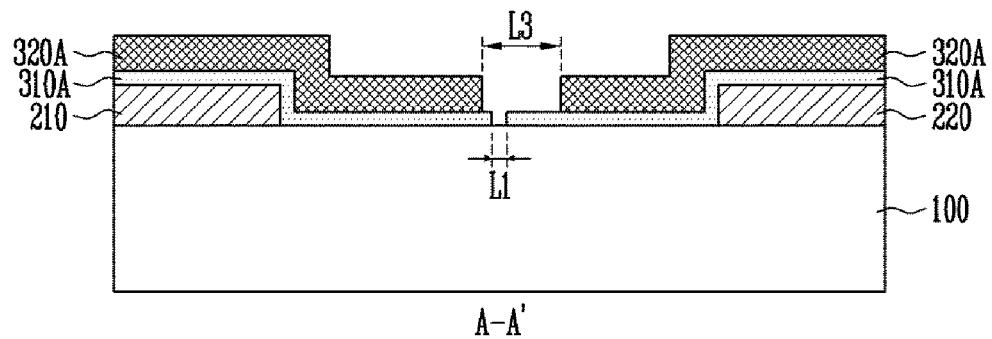
A-A'
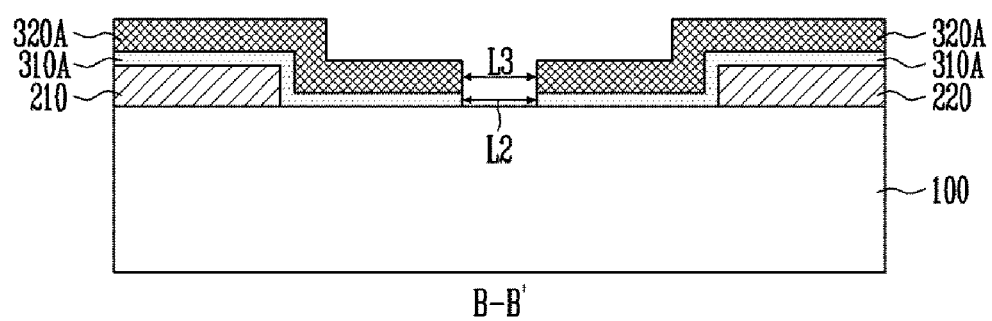
B-B'

FIG. 7D
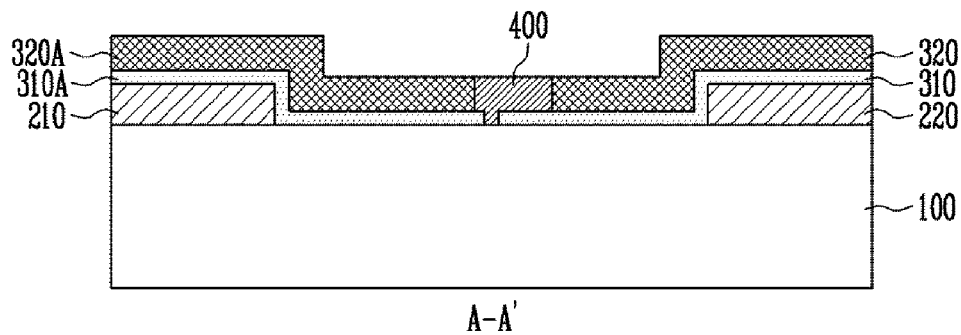
A-A'
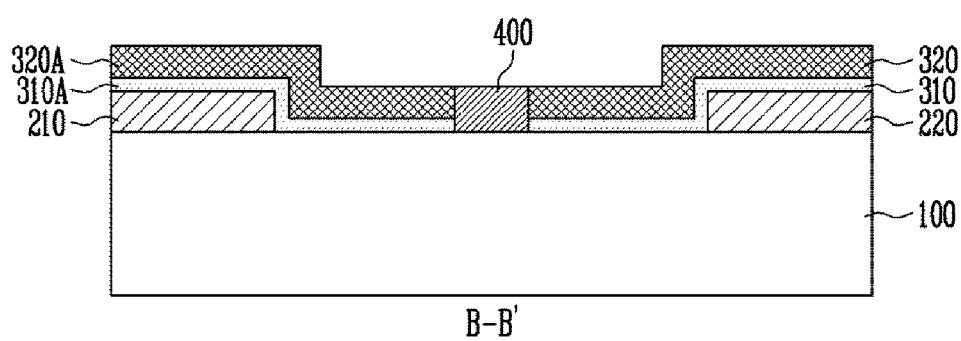
B-B'
FIG. 7E
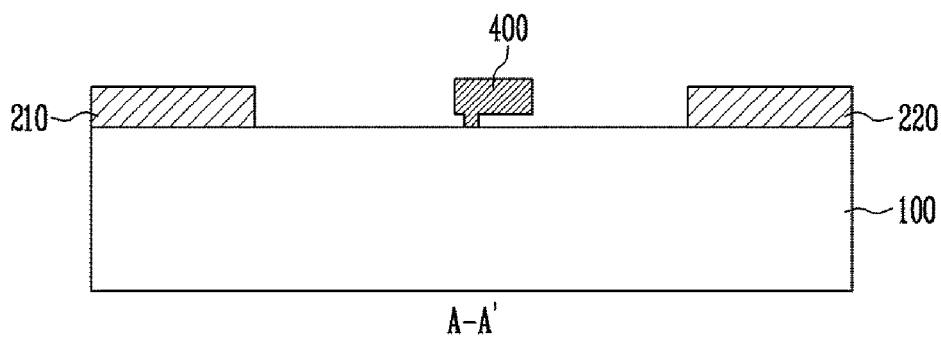
A-A'
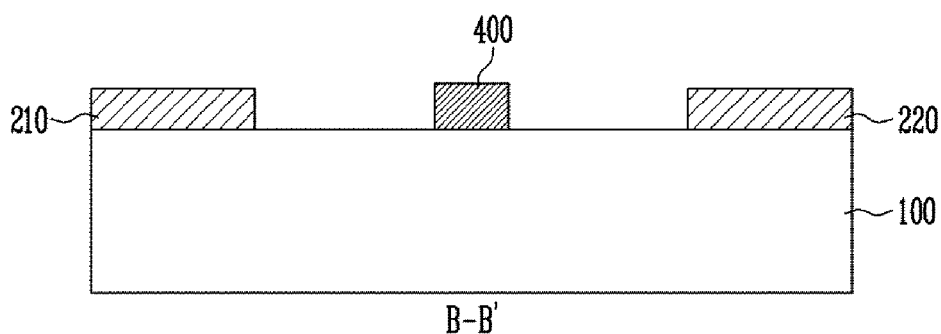
B-B'

FIG. 8
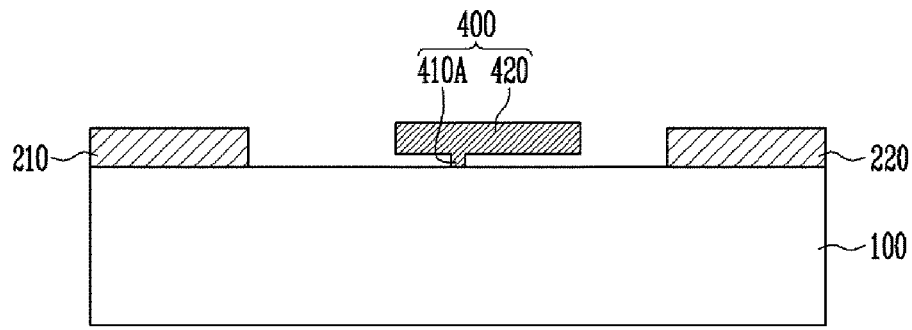
A-A'
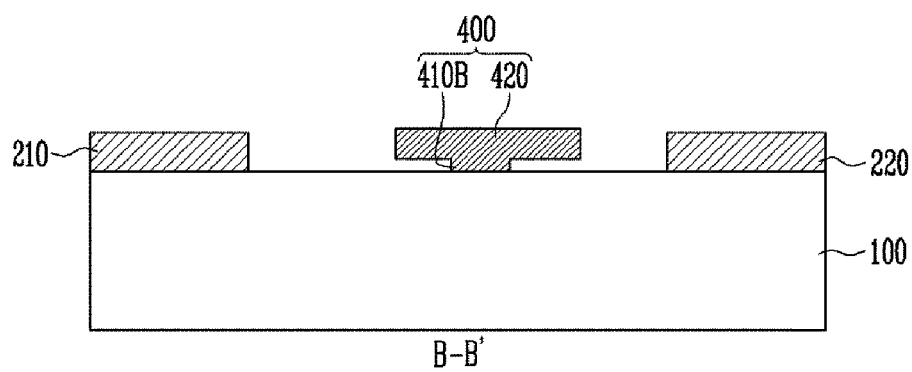
B-B'
FIG. 9
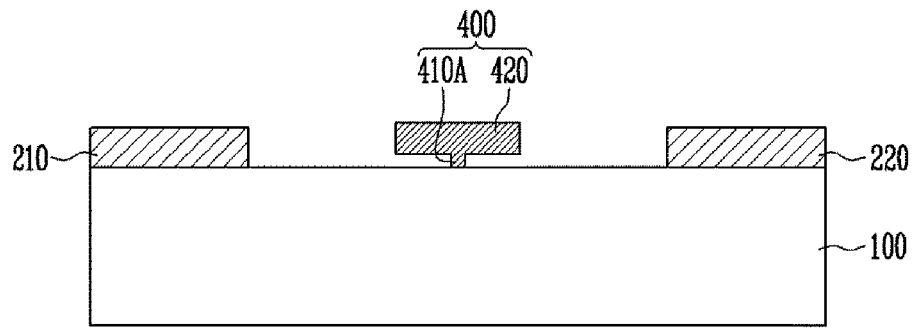
A-A'
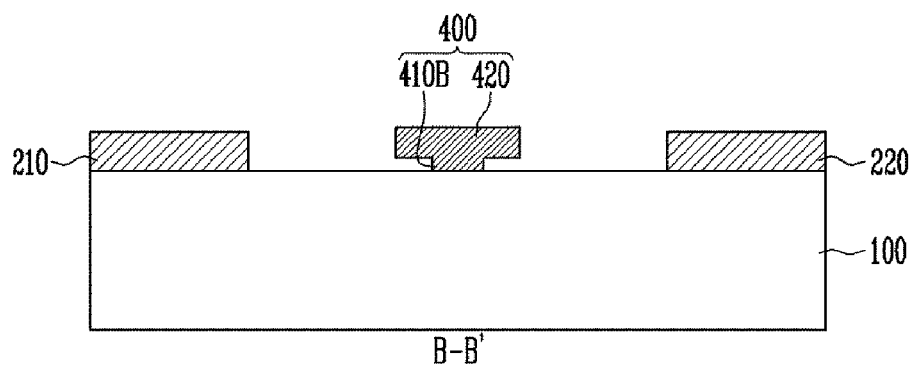
B-B'

FIG. 10
(a) 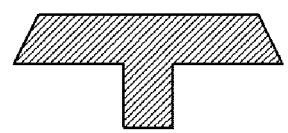
(b) 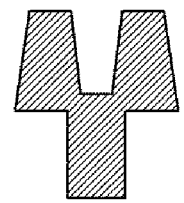
(c) 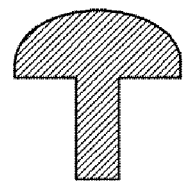
(d) 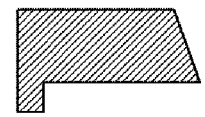

SEMICONDUCTOR DEVICE HAVING STABLE GATE STRUCTURE AND METHOD OF MANUFACTURING THE SAME

CROSS-REFERENCE TO RELATED APPLICATION

This application is based on and claims priority from Korean Patent Application No. 10-2014-0017242, filed on Feb. 14, 2014, with the Korean Intellectual Property Office, the disclosure of which is incorporated herein in its entirety by reference.

BACKGROUND

1. Field

The present invention relates to a semiconductor device having a stable gate structure, and a method of manufacturing the same. More particularly, the present invention relates to a semiconductor device, in which a gate structure having a fine gate foot having a length of 0.2 μm or smaller and a gate head having a predetermined size is stabilized by increasing an area of the gate foot, and a method of manufacturing the same.

2. Discussion of Related Art

According to development of IT technology, high-integration, high rate operation, a high voltage, a high power density, and the like of semiconductor devices become important. In the case of High Electron Mobility Transistors (HEMTs), which are GaN devices, among the semiconductor devices, a field effect transistor has risen as a high rate and high power device.

For the high rate operation of the semiconductor device, a gate length needs to be decreased. However, when the gate length is decreased, resistance is increased, so that there is a problem in that a high frequency characteristic deteriorates. Further, as integration of the semiconductor device is increased, a distance between a gate and a drain is decreased, so that a breakdown voltage is decreased. Further, a width of the gate needs to be increased in order to improve a power density, so that there is a possibility in that a gate collapses.

In order to solve the problem, in the case of the high rate, in order to decrease the gate length, a gate structure, in which a gate foot is small and a gate head is relatively large, has been used. Accordingly, a gate shaped like "T", "Y", and a mushroom is mainly used.

Further, in order to solve a decrease in a breakdown voltage generated due to a decrease in the distance between the gate and the drain for the high rate operation, a method of increasing a breakdown voltage by using a gamma (Γ) shaped gate and field plate is used. The gamma (Γ) shaped gate has a shape in which a foot portion of the gate is narrow, and a head portion of the gate elongates in one direction. The gamma (Γ) shaped gate may decrease entire resistance of the gate due to the wide head portion, and creases a depleted layer between the head portion of the gate and the drain, thereby increasing a breakdown voltage between the gate and the drain. Accordingly, the gamma (Γ) shaped gate is actually and mainly used, but in this case, the large and wide gate head is laid on the narrow gate foot, so that the gamma (Γ) shaped gate also has an unstable structure. Particularly, when the gate head is asymmetrically laid on the center gate foot, reliability during or after the process of the semiconductor is largely influenced. FIG. 1 is an SEM picture after the semiconductor process is ended, and illustrates the gate which partially collapses due to the asymmetric gate head.

In actual, a device having a high power density in a single area is demanded, and in this case, the width of the gate may be increased. When a width of a unit gate is increased as a frequency is increased, a frequency characteristic of a device is slightly decreased, and there is a problem in stability due to the increased width of the gate. That is, this phenomenon is clearer when the unit gate having the width of several hundreds of μm having the narrow gate foot of 0.2 μm stands while being dependent only on the gate foot. While the gate foot of the device operated at a low frequency is stable, a nitride-based semiconductor device having a foot of 0.2 μm or smaller is manufactured so as to be in maximal contact with air without using a dielectric material based on SiNx in order to remove a parasitic component between the gate and a substrate, and in this case, the problem becomes more severe.

In the meantime, the gate having the aforementioned structure is manufactured by a technology of forming a photoresist having a two or three layer structure, and forming a gate through etching by a difference in sensitivity of each layer. FIGS. 2 and 3 are diagrams of a process of manufacturing a semiconductor device according to the related art. Referring to FIGS. 2 and 3, first, a source electrode 21 and a drain electrode 22, which are spaced apart from each other, are formed on a substrate 10. Next, when the source electrode 21 and the drain electrode 22 are formed on the substrate 10, a first photoresist 31 and a second photoresist 32 are formed. In this case, the photoresist 31 and the second photoresist 32 are photoresists for forming a pattern in the process of manufacturing the semiconductor, and when the photoresist 31 and the second photoresist 32 are formed, a gate pattern is formed by etching the photoresist 31 and the second photoresist 32, and a metal material is deposited on the gate pattern, and then a gate electrode 40 is formed. The semiconductor device formed as described above has the gate electrode 40, in which a gate foot between the source and drain electrodes 21 and 22 has a length of 0.2 μm or smaller for a high rate operation, and a gate head is relatively larger than the gate foot as illustrated in FIG. 4.

A shape of the gate formed as described above has the head portion with a large length and the foot portion with a small length, and when the gate has a shape of "T", the gate is called a T-shaped gate (T-gate), and the gate has a shape of gamma "Γ", the gate is called a Γ-shaped gate. The technology of forming the gate in the related art adopts E-beam lithography in order to meet a minute design rule.

SUMMARY

Accordingly, in order to solve the aforementioned problems, the present invention suggests a method of improving structural stability and reliability by forming a support capable of supporting a device in a width direction of a gate head so as to make an unstable structure of the device having a narrow gate foot and a long gate head to a stable structure to increase a power density per unit area while the device is operated at a high speed.

The present invention has been made in an effort to provide a semiconductor device including a gate electrode with a stable structure including a gate foot having a length (0.2 μm or smaller) usable at a high frequency and a gate head having a predetermined size regardless of an exposure source or exposure equipment.

Further, the present invention has been made in an effort to provide a method of manufacturing a semiconductor device including a gate electrode with a stable structure including a gate foot having a length (0.2 μm or smaller) usable at a high frequency and a gate head having a predetermined size regardless of an exposure source or exposure equipment An embodiment of the present invention provides a semiconductor device, including: a source electrode and a drain electrode, which are spaced apart from each other on a substrate; and a gate electrode including a gate head positioned between the source electrode and the drain electrode, and a first gate foot positioned at under the gate head and a second gate foot connected with the first gate foot and having a larger length than that of the first gate foot.

According to the exemplary embodiments of the present invention, it is possible to form a T-shaped, a Y-shaped, a gamma (Γ)-shaped gate electrode including a gate foot with 0.2 µm or smaller usable at a high frequency and a gate head pattern having a predetermined size larger than 0.2 µm. Particularly, the gate electrode may have a stable structure by increasing the length of a partial region of the gate foot so as to support the gate head relatively larger than the gate foot. Accordingly, it is possible to prevent the gate electrode of the semiconductor device from collapsing or being inclined and improve reliability of the semiconductor device during or after the process of the semiconductor device.

Further, it is possible to provide a device having a stable structure and improved reliability by using photolithography, which is incapable of providing resolution of 0.1 µm, that is, a contact type photolithography, a proximity exposure type photolithography, and a stepper using i-line and G-line as sources.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIG. 2 is a process diagram illustrating an example of a process of manufacturing a semiconductor device according to the related art;

FIG. 3 is a process diagram illustrating another example of a process of manufacturing a semiconductor device according to the related art;

FIG. 4 is a front view illustrating the semiconductor device after the process of manufacturing the semiconductor device according to the related art is completed;

FIGS. 6A to 6E are cross-sectional views illustrating a method of manufacturing a semiconductor device according to an exemplary embodiment of the present invention;

FIGS. 7A to 7E are cross-sectional views illustrating a method of manufacturing the semiconductor device according to the exemplary embodiment of the present invention;

FIG. 8 is a cross-sectional view illustrating the semiconductor device including a gamma-shaped gate electrode according to the exemplary embodiment of the present invention;

FIG. 9 is a cross-sectional view illustrating the semiconductor device including a T-shaped gate electrode according to the exemplary embodiment of the present invention; and FIG. 10 is a diagram illustrating various shapes of the gate electrode according to the exemplary embodiment of the present invention.

DETAILED DESCRIPTION

Figure 1:
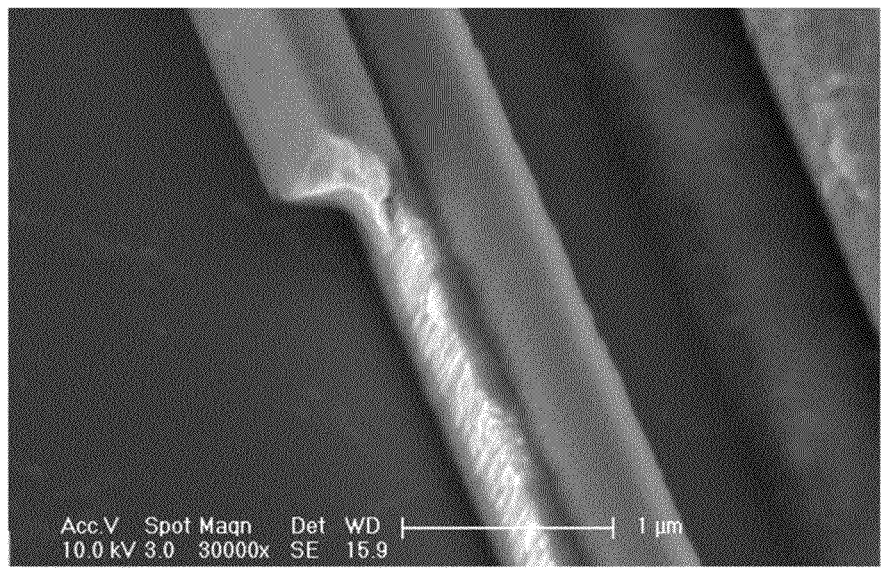
FIG. 1 is an SEM picture in which a gate electrode is cut after a semiconductor process is completed.

Hereinafter, the most preferable embodiment of the present invention will be described. In the drawings, the thicknesses and the intervals of elements are exaggerated for convenience of illustration, and may be exaggerated compared to an actual physical thickness. In describing the present invention, a publicly known configuration irrelevant to the principal point of the present invention may be omitted. It should note that in giving reference numerals to elements of each drawing, like reference numerals refer to like elements even though like elements are shown in different drawings.

A semiconductor device according to an exemplary embodiment of the present invention has different lengths according to a region of a gate foot in a gate structure including the gate foot having a length of 2 µm or smaller, and a gate head relatively larger than the gate foot. As described above, the length of a partial region of the gate foot is increased, so that the semiconductor device according to the exemplary embodiment of the present invention includes a structure, in which the gate head is stably supported by the region of which the length is expanded. Hereinafter, a structure and a manufacturing method of the semiconductor device according to the exemplary embodiment of the present invention will be described with reference to the accompanying drawings.

FIGS. 5A to 5D are views illustrating a structure of the semiconductor device according to the exemplary embodiment of the present invention.

Figure 5A:
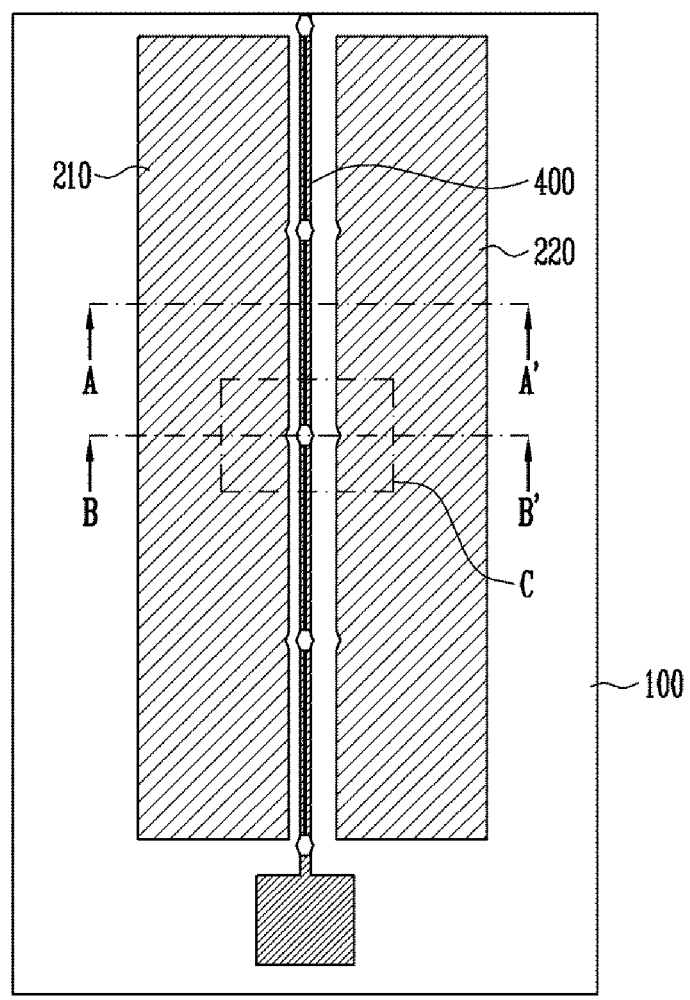
FIGS. 5A to 5D are views illustrating a structure of a semiconductor device according to an exemplary embodiment of the present invention.
Figure 5B:
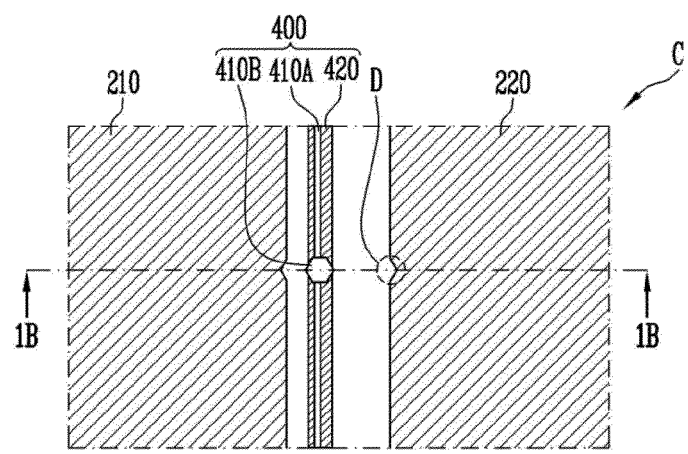
Figure 5C:
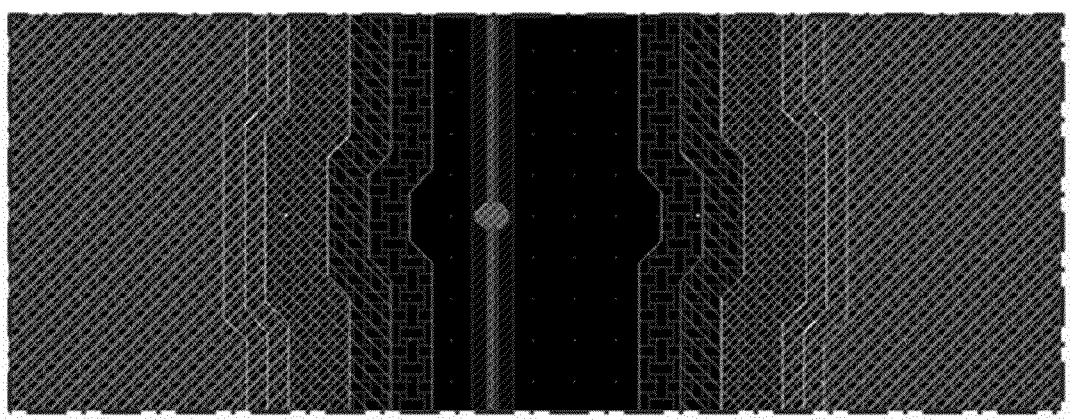

FIG. 5A is a top plan view of the semiconductor device, FIG. 5B is a partial view of enlarged region C, and FIG. 5C illustrates an example of an actual layout of FIG. 5B. As illustrated in FIGS. 5A to 5C, the semiconductor device according to the exemplary embodiment of the present invention includes a source electrode 210 and a drain electrode 220, which are spaced apart from each other on a substrate 100, and a gate electrode 400 positioned between the source electrode 210 and the drain electrode 220. Here, the gate electrode 400 includes a gate head 420 and first and second gate foots 410A and 410B positioned in a low portion of the gate head 420.

In the meantime, an operation of the semiconductor device is influenced by a distance between the source electrode 210 and the gate electrode 400, and a distance between the gate electrode 400 and the drain electrode 220. Accordingly, considering a maximum breakdown voltage, a frequency characteristic, and the like of the semiconductor device, it is necessary to adjust the distance between the source electrode 210 and the gate electrode 400, and the distance between the gate electrode 400 and the drain electrode 220. According to the exemplary embodiment of the present invention, the second gate foot 410B has a larger length than that of the first gate foot 410A, so that a distance between the second gate foot 410B and the source or drain electrode 210 or 220 is decreased compared to that of the related art. Accordingly, in order to supplement this problem, the source electrode 210 and/or the drain electrode 220 may include a groove D formed at a position corresponding to the second gate foot 410B. For example, the groove D has a size corresponding to a difference in a length of the second gate foot 410B and the first gate foot 410A. Accordingly, it is possible to appropriately adjust an interval between the second gate foot 410B and the source electrode 210 and/or the drain electrode 220.

Figure 5D:
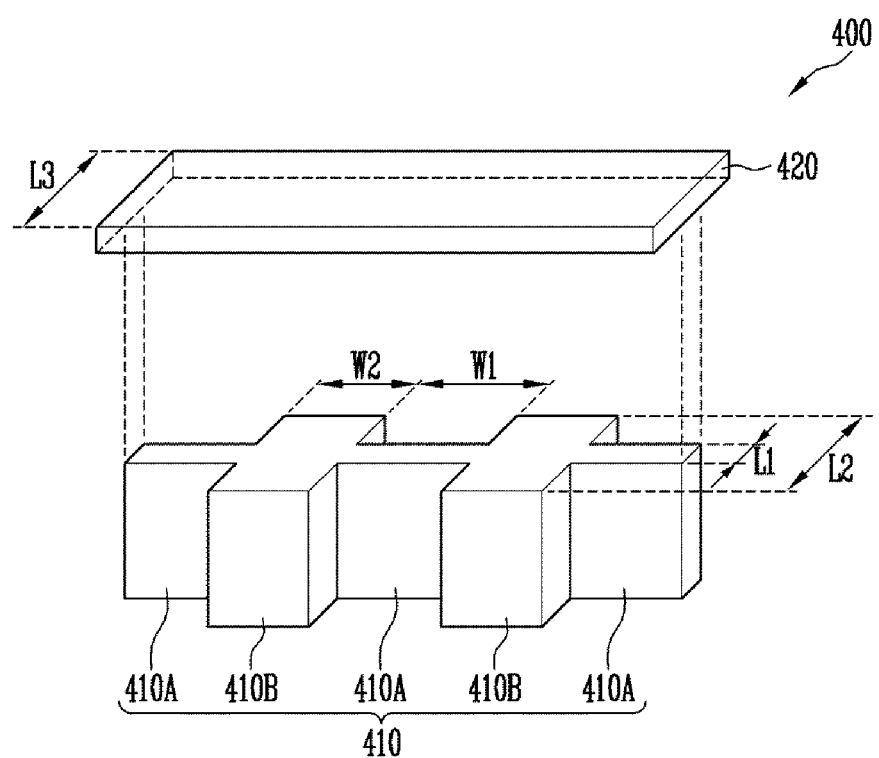

FIG. 5D is a perspective view illustrating the gate electrode. In the present drawing, for convenience of the description, the gate head 420 and the gate foot 410 are separately illustrated. As illustrated in FIG. 5D, the gate electrode 400 includes the gate head 420, and the gate foot 410 positioned under of the gate head 420.

The gate head 420 may have a relatively larger length than the gate foot 410, and have a structure expanded toward the source electrode 210 and/or the drain electrode 220. Further, the gate head 420 may have an asymmetric structure further expanded toward one of the source electrode 210 and the drain electrode 220. According to the various shapes of the gate head 420, the gate electrode 400 may have a shape of "T", "Y", a mushroom, or a gamma "Γ".

The gate foot 410 may include a plurality of first gate feet 410A and a plurality of second gate feet 410B, which are alternately arranged. Further, the first gate feet 410A and the second gate feet 410B may be formed in an integrally connected one layer. For example, the first gate feet 410A and the second gate feet 410B have different lengths (L1≠L2). The length L2 of the second gate foot 410B may have a larger value than the length L1 of the first gate foot 410A. Further, the length L2 of the second gate foot 410B may have a value which is the same as or smaller than a length L3 of the gate head 420. Here, the length of the first gate foot 410A and the second gate foot 420B may be 0.2 µm or smaller.

Here, the number of second gate feet 410B included in one gate foot 410, the widths W1 and W2 of the first and second gate feet, the shape of the cross-section of the second gate foot 410B, and the like may be determined considering the breakdown voltage, the frequency characteristic, and the like of the semiconductor device. For example, the cross-section of the second gate foot 410B may have various shapes, such as a circle, an ellipse, a quadrangle, a hexagon, and polygon.

FIGS. 6A to 6E are cross-sectional views illustrating a method of manufacturing a semiconductor device according to an exemplary embodiment of the present invention, and illustrate a cross-section taken along line A-A' or B-B' of FIG. 5A. Hereinafter, a method of manufacturing a semiconductor device including a T-shaped gate electrode will be described with reference to the drawings.

As illustrated in FIG. 6A, first, the source electrode 210 and the drain electrode 220, which are spaced apart from each other, are formed on the substrate 100. Here, the substrate 100 may be a predetermined substrate usable for fabricating a field effect transistor, such as a GaAs substrate or a GaN substrate. Further, the source electrode 210 and the drain electrode 220 may include a metal material.

For reference, the source electrode 210 and the drain electrode 220 may be patterned so as to include a groove in the cross-section taken along line B-B' so that the source electrode 210 and the drain electrode 220, and the second gate feet may have a sufficient interval. In this case, the source electrode 210 and the drain electrode 220 of the cross-section taken along line B-B' may have a smaller length L4 than that of the source electrode 210 and the drain electrode 220 of the cross-section taken along line A-A'.

As illustrated in FIG. 6B, a first photoresist 310 and a second photoresist 320 covering the source electrode 210 and the drain electrode 220 are formed on the substrate 100. Here, the first photoresist 310 and the second photoresist 320 are photoresists for forming a pattern during the semiconductor process, and particularly, a photoresist, such as polymethyl methacrylate (PMMA), capable of forming a fine pattern may be used.

As illustrated in FIG. 6C, a first photoresist pattern 310A including a first opening and a second photoresist pattern 310B including a second opening are formed by patterning the first and second photoresists 310 and 320. For example, the first and second photoresists 310 and 320 may be etched by using a dry etching process or a wet etching process.

For reference, a forming sequence of the first and second photoresist patterns 310A and 310B may be changed. For example, after the first photoresist 310 is formed, the first photoresist pattern 310A is formed by patterning the first photoresist 310. Next, after the second photoresist 320 is formed on the first photoresist pattern 310A, the second photoresist pattern 310B is formed by patterning the second photoresist 320.

Here, the first opening is a region, in which the gate foot is to be formed, and has a relatively smaller first length L1 in a region A-A', in which the first gate foot is to be formed, and a relatively larger second length L2 in a region B-B', in which the second gate foot is to be formed. Further, the second opening is a region in which the gate head is to be formed, and has a relatively large third length L3.

Further, as illustrated in FIG. 6D, the gate electrode 400 is formed by depositing a metal material inside the first opening and the second opening.

As illustrated in FIG. 6E, the first photoresist pattern 310A and the second photoresist pattern 320A are removed. Accordingly, the gate electrode 400 including the gate head, which is stably supported by the second gate foot having the relatively large length L2, is formed. Here, the gate electrode 400 may have the shape of "T" in the cross-section taken along line A-A' and have a structure in which the gate foot is expanded to substantially have the same length as that of the gate head in the cross-section taken along line B-B'.

For reference, the gate electrode having various shapes, such as a "Y" shape and a mushroom shape, may be formed by changing the shape of the first opening. Further, the gate electrode 400 may be in direct contact with the substrate 100, or a dielectric layer may be interposed between the substrate 100 and the gate electrode 400.

FIGS. 7A to 7E are cross-sectional views illustrating a method of manufacturing a semiconductor device according to an exemplary embodiment of the present invention, and illustrate a cross-section taken along line A-A' or B-B' of FIG. 5A. Hereinafter, a method of manufacturing a semiconductor device including a gamma-shaped gate electrode will be described with reference to the drawings.

As illustrated in FIG. 7A, first, the source electrode 210 and the drain electrode 220, which are spaced apart from each other, are formed on the substrate 100. Here, the substrate 100 may be a predetermined substrate usable for fabricating a field effect transistor, such as a GaAs substrate or a GaN substrate. Further, the source electrode 210 and the drain electrode 220 may include a metal material.

For reference, the source electrode 210 and the drain electrode 220 may be patterned so as to include a groove in the cross-section taken along line B-B' so that the source electrode 210 and the drain electrode 220, and the second gate feet may have a sufficient interval. In this case, the source electrode 210 and the drain electrode 220 of the cross-section taken along line B-B' may have a smaller length L4 than that of the source electrode 210 and the drain electrode 220 of the cross-section taken along line A-A'.

As illustrated in FIG. 7B, a first photoresist 310 and a second photoresist 320 covering the source electrode 210 and the drain electrode 220 are formed on the substrate 100. Here, the first photoresist 310 and the second photoresist 320 are photoresist for forming a pattern during the semiconductor process, and particularly, a photoresist, such as polymethyl methacrylate (PMMA), capable of forming a fine pattern may be used.

As illustrated in FIG. 7C, a first photoresist pattern 310A including a first opening and a second photoresist pattern 310B including a second opening are formed by patterning the first and second photoresists 310 and 320. For example, the first and second photoresists 310 and 320 may be etched by using a dry etching process or a wet etching process.

Here, the first opening is a region, in which the gate foot is to be formed, and has a relatively smaller first length L1 in a region A-A', in which the first gate foot is to be formed, and a relatively larger second length L2 in a region B-B', in which the second gate foot is to be formed. Further, the second opening is a region in which the gate head is to be formed, and has a relatively large third length L3. Here, the second opening may be asymmetrically expanded toward the source electrode 210 or the drain electrode 220. The present drawing illustrates the case where the second opening is further expanded in the direction of the drain electrode 220.

Further, as illustrated in FIG. 7D, the gate electrode 400 is formed by depositing a metal material inside the first opening and the second opening.

As illustrated in FIG. 7E, the first photoresist pattern 310A and the second photoresist pattern 320A are removed. Accordingly, the gate electrode 400 including the gate head, which is stably supported by the second gate foot having the relatively large length L2, is formed. Here, in the cross section taken along line A-A' of the gate electrode 400, the gate head is asymmetrically expanded in the direction of the drain electrode 220 to have a gamma shape. Further, in the cross section taken along line B-B' of the gate electrode 400, the gate foot is expanded to substantially have the same length as that of the gate head.

FIG. 8 is a cross-sectional view illustrating the semiconductor device including the gamma-shaped gate electrode 400 according to the exemplary embodiment of the present invention. As illustrated in FIG. 8, the gate electrode 400 includes the gate head 420 asymmetrically expanded in the direction of the drain electrode 220. Further, the second gate feet 410B have the larger lengths than those of the first gate feet 410A, thereby stably supporting the gate head 420 asymmetrically expanded in the direction of the drain electrode 220.

FIG. 9 is a cross-sectional view illustrating the semiconductor device including the T-shaped gate electrode 400 according to the exemplary embodiment of the present invention. As illustrated in FIG. 8, the gate electrode 400 includes the gate head 420 symmetrically expanded in the direction of the source electrode 210 and the direction of the drain electrode 220. Further, the second gate feet 410B have the larger lengths than those of the first gate feet 410A, thereby stably supporting the gate head 420.

FIG. 10 is a diagram illustrating various shapes of the gate electrode according to the exemplary embodiment of the present invention. As illustrated in FIG. 10, the gate electrode may include various shapes of gate head, so that the gate electrode having various shapes, such as a "T" shape, a "Y" shape, a mushroom shape, and a gamma (Γ) shape, may be formed according to the shape of the gate head. Particularly, according to the present invention, the gate head is stably supported by the second gate feet, so that it is possible to more variously change the shape of the gate head.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor device, comprising:
   a source electrode and a drain electrode, which are spaced apart from each other on a substrate; and
   a gate electrode including a gate head positioned between the source electrode and the drain electrode, and a first gate foot positioned at under the gate head and a second gate foot connected with the first gate foot and having a larger length than that of the first gate foot.

2. The semiconductor device of claim 1, wherein the length of the second gate foot is the same as or smaller than a length of the gate head.

3. The semiconductor device of claim 1, wherein the first gate foot and the second gate foot are formed as one layer.

4. The semiconductor device of claim 1, wherein the lengths of the first gate foot and the second gate foot are equal to or smaller than 0.2 µm.

5. The semiconductor device of claim 1, wherein the gate head has a form expanded toward the source electrode or the drain electrode.

6. The semiconductor device of claim 1, wherein the source electrode or the drain electrode includes a groove formed at a position corresponding to the second gate foot.

7. The semiconductor device of claim 1, wherein a shape of the gate electrode is selected from the group consisting of a T shape, a Y shape, a mushroom shape, and a gamma (Γ) shape.

8. The semiconductor device of claim 1, wherein a cross-section of the second gate foot has a shape selected from the group consisting of a circle, an ellipse, a quadrangle, a hexagon, and a polygon.

9. A method of manufacturing a semiconductor device, comprising:
   forming a source electrode and a drain electrode on a substrate; and
   forming a gate electrode including a gate head positioned between the source electrode and the drain electrode, and a first gate foot positioned under the gate head and a second gate foot connected with the first gate foot and having a larger length than that of the first gate foot on the substrate.

10. The method of claim 9, wherein the forming of the gate electrode includes:
    forming a first mask pattern configured to cover the source electrode and the drain electrode, and including a first opening at a position, at which the first gate foot and the second gate foot are to be formed;
    forming a second mask pattern configured to cover the first mask pattern, and including a second opening at a position at which the gate head is to be formed; and
    forming the gate electrode within the first opening and the second opening.

11. The method of claim 9, wherein the source electrode or the drain electrode are formed to have a groove at a position corresponding to the second gate foot.

* * * * *